(12) United States Patent
Yu

(10) Patent No.: US 9,979,350 B2
(45) Date of Patent: May 22, 2018

(54) OPERATIONAL AMPLIFIER BASED CIRCUIT WITH COMPENSATION CIRCUIT BLOCK USED FOR STABILITY COMPENSATION

(71) Applicant: MEDIATEK INC., Hsin-Chu (TW)

(72) Inventor: Chi-Yao Yu, Hsinchu County (TW)

(73) Assignee: MEDIATEK INC., Hsin-Chu (TW)

( * ) Notice: Subject to any disclaimer, the term of this patent is extended or adjusted under 35 U.S.C. 154(b) by 0 days. days.

(21) Appl. No.: 14/920,894

(22) Filed: Oct. 23, 2015

(65) Prior Publication Data

US 2016/0142016 A1 May 19, 2016

Related U.S. Application Data

(60) Provisional application No. 62/080,989, filed on Nov. 17, 2014.

(51) Int. Cl.
*H03F 3/45* (2006.01)
*H03F 1/14* (2006.01)
(Continued)

(52) U.S. Cl.
CPC .......... *H03F 1/0205* (2013.01); *H03F 1/086* (2013.01); *H03F 1/14* (2013.01); *H03F 1/42* (2013.01); *H03F 1/483* (2013.01); *H03F 3/193* (2013.01); *H03F 3/45179* (2013.01); *H03F 3/45183* (2013.01); *H03F 3/45659* (2013.01); *H03F 2200/129* (2013.01); *H03F 2200/135* (2013.01); *H03F 2200/144* (2013.01); *H03F 2200/153* (2013.01); *H03F 2200/165* (2013.01); *H03F 2200/411* (2013.01); *H03F 2200/555* (2013.01);
(Continued)

(58) Field of Classification Search
CPC ................. H03F 1/14; H03F 1/34; H03F 3/45
USPC ................................. 330/258, 259, 260, 292
See application file for complete search history.

(56) References Cited

U.S. PATENT DOCUMENTS

| 4,368,435 A | * | 1/1983 | Bloy | .................... H03G 3/3005 |
| | | | | 330/126 |
| 5,880,634 A | * | 3/1999 | Babanezhad | ....... H03F 3/45475 |
| | | | | 327/557 |

(Continued)

FOREIGN PATENT DOCUMENTS

| CA | 2611753 C | 6/2013 |
| CN | 103117719 A | 5/2013 |

(Continued)

OTHER PUBLICATIONS

Ron Mancini, Stability Analysis of Voltage-Feedback Op Amps Including Compensation Techniques, Application Report, Mixed Signal Products, Mar. 2001, SLOA020A, XP055261426, Texas Instruments Incorporated.

(Continued)

*Primary Examiner* — Steven J Mottola
(74) *Attorney, Agent, or Firm* — Winston Hsu

(57) ABSTRACT

An operational amplifier based circuit has an operational amplifier, a feedback circuit, and a compensation circuit block. The feedback circuit is coupled between an output port and an input port of the operational amplifier. The compensation circuit block has circuits involved in stability compensation of the operational amplifier, wherein there is no stability compensation circuit driven at the output port of the operational amplifier.

38 Claims, 6 Drawing Sheets

(51) Int. Cl.
*H03F 1/02* (2006.01)
*H03F 1/08* (2006.01)
*H03F 1/48* (2006.01)
*H03F 1/42* (2006.01)
*H03F 3/193* (2006.01)

(52) U.S. Cl.
CPC ...... *H03F 2200/75* (2013.01); *H03F 2200/91* (2013.01); *H03F 2203/45036* (2013.01); *H03F 2203/45051* (2013.01); *H03F 2203/45074* (2013.01); *H03F 2203/45082* (2013.01); *H03F 2203/45088* (2013.01); *H03F 2203/45116* (2013.01); *H03F 2203/45134* (2013.01); *H03F 2203/45151* (2013.01); *H03F 2203/45156* (2013.01); *H03F 2203/45178* (2013.01); *H03F 2203/45188* (2013.01); *H03F 2203/45208* (2013.01); *H03F 2203/45264* (2013.01); *H03F 2203/45332* (2013.01); *H03F 2203/45336* (2013.01); *H03F 2203/45338* (2013.01); *H03F 2203/45418* (2013.01); *H03F 2203/45422* (2013.01); *H03F 2203/45424* (2013.01); *H03F 2203/45434* (2013.01); *H03F 2203/45512* (2013.01); *H03F 2203/45526* (2013.01); *H03F 2203/45528* (2013.01); *H03F 2203/45544* (2013.01); *H03F 2203/45546* (2013.01); *H03F 2203/45548* (2013.01); *H03F 2203/45594* (2013.01); *H03F 2203/45601* (2013.01); *H03F 2203/45631* (2013.01); *H03F 2203/45632* (2013.01); *H03F 2203/45642* (2013.01); *H03F 2203/45644* (2013.01); *H03F 2203/45646* (2013.01); *H03F 2203/45648* (2013.01); *H03F 2203/45702* (2013.01)

(56) References Cited

U.S. PATENT DOCUMENTS

| | | | |
|---|---|---|---|
| 7,948,309 B2 | 5/2011 | Mak | |
| 7,999,612 B2 | 8/2011 | Hsieh | |
| 8,791,755 B2 | 7/2014 | Giotta | |
| 2003/0102917 A1* | 6/2003 | Wu | H03F 1/08 330/260 |
| 2005/0088228 A1 | 4/2005 | Tai | |
| 2009/0309591 A1* | 12/2009 | Goodman | G01V 3/24 324/303 |
| 2010/0134190 A1* | 6/2010 | Ballarin | H03F 3/45183 330/294 |
| 2012/0019317 A1 | 1/2012 | Giotta | |
| 2014/0132341 A1* | 5/2014 | Wang | H03F 1/14 330/69 |
| 2014/0218113 A1 | 8/2014 | Wang | |

FOREIGN PATENT DOCUMENTS

| | | |
|---|---|---|
| CN | 103986429 A | 8/2014 |
| GB | 2488307 A | 8/2012 |

OTHER PUBLICATIONS

Pradeep Shettigar et al., "A 15mW 3.6GS/s CT-Delta Sigma ADC with 36MHz Bandwidth and 83dB DR in 90nm CMOS", 2012 IEEE International Solid-State Circuits Conference, Feb. 21, 2012, p. 156-157.

* cited by examiner

OPERATIONAL AMPLIFIER BASED CIRCUIT WITH COMPENSATION CIRCUIT BLOCK USED FOR STABILITY COMPENSATION

CROSS REFERENCE TO RELATED APPLICATIONS

This application claims the benefit of U.S. provisional application No. 62/080,989, filed on Nov. 17, 2014 and incorporated herein by reference.

BACKGROUND

The present invention relates to signal processing, and more particularly, to an operational amplifier based circuit with a compensation circuit block used for stability compensation.

With the advance of the wireless communications system, the baseband bandwidth becomes wider. Hence, a more stringent receiver (RX) requirement is needed by a broadband system such as an LTE-Advanced (LTE-A) system for ensuring the received signal quality. For example, to prevent noise figure (NF) degradation on the signal channel edge, a current-mode CR filter (e.g., low-pass filter) between a mixer and an operational amplifier based circuit (e.g., a transimpedance amplifier (TIA)) cannot be configured to filter out the blocker signal on the signal channel edge. If the current-mode CR filter is configured to filter out the blocker signal on the signal channel edge, the source impedance of the TIA is significantly reduced on the signal channel edge. However, the reduced source impedance of the TIA will result in increased noise in the output of the TIA, thus leading to NF degradation on the signal channel edge. Further, the operational amplifier implemented in the TIA needs to provide broadband input impedance as mixer's load to maintain mixer's linearity, and must have capability to sustain the blocker signal. Thus, there is a need for a wide-bandwidth and high-linearity operational amplifier based circuit with an innovative stability compensation design.

SUMMARY

One of the objectives of the claimed invention is to provide an operational amplifier based circuit with a compensation circuit block used for stability compensation. For example, the stability of an operational amplifier is maintained by the proposed compensation circuit block without adding extra compensation capacitors at the output port of the operational amplifier.

According to a first aspect of the present invention, an exemplary operational amplifier based circuit is disclosed. The exemplary operational amplifier based circuit includes an operational amplifier, a feedback circuit, and a compensation circuit block. The feedback circuit is coupled between an output port and an input port of the operational amplifier. The compensation circuit block has circuits involved in stability compensation of the operational amplifier, wherein there is no stability compensation circuit driven at the output port of the operational amplifier.

According to a second aspect of the present invention, an exemplary operational amplifier based circuit is disclosed. The exemplary operational amplifier based circuit includes a multi-stage amplifier, a feedback circuit, and a compensation circuit block. The multi-stage amplifier has an output stage. The feedback circuit is coupled between an output port and an input port of the multi-stage operational amplifier, and includes a first feedback network. The first feedback network includes a first node, coupled to one input node of the input port; and a second node, coupled to one output node of the output port. The compensation circuit block has circuits involved in stability compensation of the multi-stage operational amplifier, and includes a first compensation circuit. The first compensation circuit is coupled between the first node of the feedback network and one input node of the output stage. The compensation circuit block comprises a first part of a stability compensation circuit arranged to apply the stability compensation to the multi-stage operational amplifier, and the feedback circuit is reused as a second part of the stability compensation circuit.

According to a third aspect of the present invention, an exemplary operational amplifier based circuit is disclosed. The exemplary operational amplifier based circuit includes a differential operational amplifier, a feedback circuit, and a compensation circuit block. The feedback circuit is coupled between an output port and an input port of the differential operational amplifier. The compensation circuit block has circuits involved in stability compensation of the differential operational amplifier. The compensation circuit block comprises a first part of a common-mode stability compensation circuit arranged to apply common-mode stability compensation to the differential operational amplifier, and the feedback circuit is reused as a second part of the common-mode stability compensation circuit.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
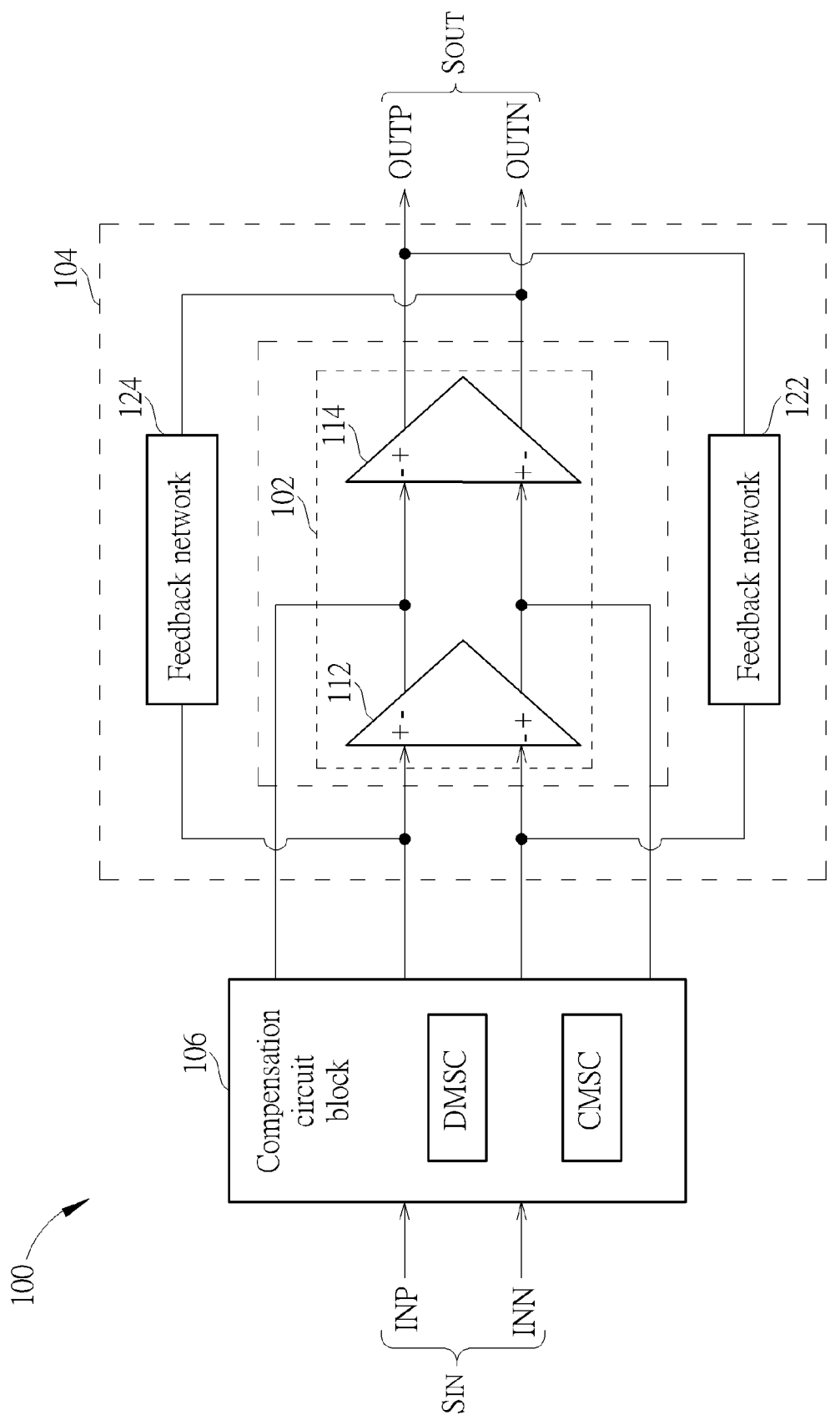
FIG. 1 is a block diagram illustrating an operational amplifier based circuit according to an embodiment of the present invention.

FIG. 1 is a block diagram illustrating an operational amplifier based circuit according to an embodiment of the present invention. The operational amplifier based circuit 100 may be a transimpedance amplifier (TIA) or a filter. The operational amplifier based circuit 100 includes an operational amplifier (OP AMP) 102, a feedback circuit 104, and a compensation circuit block 106. In this embodiment, the operational amplifier 102 is implemented using a multi-stage amplifier. For example, the operational amplifier 102 is a two-stage amplifier including a first stage (e.g., an input stage 112) and a second stage (e.g., an output stage 114). Further, the operational amplifier 102 in this embodiment is a differential amplifier. Hence, the input signal $S_{IN}$ of the operational amplifier based circuit 100 is a differential signal having a positive input signal INP and a negative input signal INN, and the output signal $S_{OUT}$ of the operational amplifier based circuit 100 is a differential signal having a positive output signal OUTP and a negative output signal OUTN.

The feedback circuit 104 is coupled between an output port and an input port of the operational amplifier 102. Since the operational amplifier 102 is a differential multi-stage amplifier, the input port of the operational amplifier 102 includes a positive input node (which is also a positive input node of the input stage 112) and a negative input node (which is also a negative input node of the input stage 112), and the output port of the operational amplifier 102 includes a positive output node (which is also a positive output node of the output stage 114) and a negative output node (which is also a negative output node of the output stage 114). In addition, the feedback circuit 104 includes two feedback networks 122 and 124. The feedback network 122 is coupled between the positive input node (+) of the input stage 112 and the negative output node (−) of the output stage 114. The feedback network 124 is coupled between the negative input node (−) of the input stage 112 and the positive output node (+) of the output stage 114. Hence, the operational amplifier 102 has a negative feedback configuration due to the feedback circuit 104.

The compensation circuit block 106 includes circuits involved in stability compensation of the operational amplifier 102. For example, the compensation circuit block 106 includes circuits for differential-mode stability compensation (DMSC). For another example, the compensation circuit block 106 includes circuits for common-mode stability compensation (CMSC). For yet another example, the compensation circuit block 106 includes circuits for DMSC and CMSC. In this embodiment, the compensation circuit block 106 includes a first part of a stability compensation circuit arranged to apply stability compensation (e.g., DMSC or CMSC) to the operational amplifier 102, and the feedback circuit 104 is reused as a second part of the stability compensation circuit.

To provide a broadband input impedance, the bandwidth of the whole operational amplifier 102 needs to be extended. Moreover, to maintain a good linearity performance in the broadband operation, the driving capabilities of both input stage 112 and output stage 114 need to be improved. It should be noted that it is more important for output stage 114 since it has larger input voltage swing in comparison to the input stage 112. One proposed solution to reduce the input voltage swing of the output stage 114 is to enlarge its gain (i.e. driving capability) at the interested frequency (e.g. the frequency of the interference). The present invention proposes keeping the broadband advantage of the whole operational amplifier 102 while enhancing the driving capabilities of both the input stage 112 and the output stage 114 for better linearity performance. In one exemplary design, there is no stability compensation circuit driven at the output port of the both input stage 112 and output stage 114, such that their driving capabilities can be significantly improved. For example, there is no conventional Miller compensation capacitor cross the output stage 114. The present invention further proposes an innovative stability compensation technique under the condition that no conventional Miller compensation capacitor is cross the output stage 114. Since the feedback circuit 104 is reused as part of the stability compensation circuit, none of the circuits include in the compensation circuit block 106 is driven at the output port of the operational amplifier 102. Compared to the conventional operational amplifier design, the load of the input stage 112 and output stage 114 can be reduced to thereby enhance their driving capabilities as well as the linearity of the overall operational amplifier 102. Further details of the operational amplifier based circuit 100 are described as below.

Figure 2:
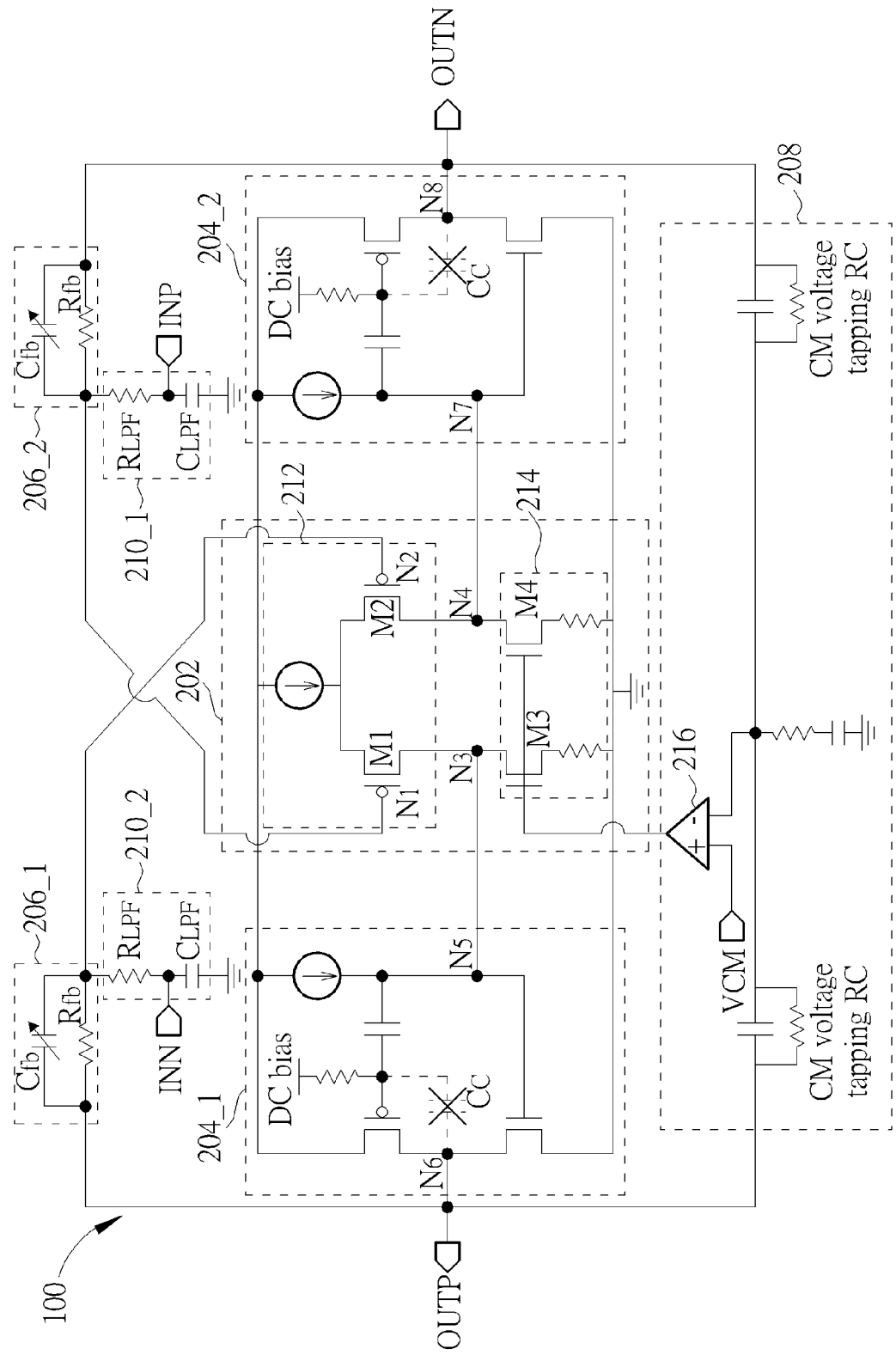
FIG. 2 is a circuit diagram of an operational amplifier based circuit according to an embodiment of the present invention.

FIG. 2 is a circuit diagram of an operational amplifier based circuit according to an embodiment of the present invention. The operational amplifier based circuit 100 shown in FIG. 1 can be implemented using the circuit structure shown in FIG. 2. The operational amplifier based circuit 100 includes a plurality of circuit blocks 202, 204_1, 204_2 used to implement the operational amplifier 102 shown in FIG. 1, where the circuit block 202 serves as the input stage 112, and the circuit blocks 204_1, 204_2 serve as the output stage 114. The input node $N_1$ of the circuit block 202 serves as the positive input node (+) of the input stage 112, the input node $N_2$ of the circuit block 202 serves as the negative input node (−) of the input stage 112, the output node $N_3$ of the circuit block 202 serves as the negative output node (−) of the input stage 112, and the output node $N_4$ of the circuit block 202 serves as the positive output node (+) of the input stage 112. The input node $N_5$ of the circuit block 204_1 serves as the negative input node (−) of the output stage 114, the output node $N_6$ of the circuit block 204_1 serves as the positive output node (+) of the output stage 114, the input node $N_7$ of the circuit block 2042 serves as the positive input node (+) of the output stage 114, and the output node $N_8$ of the circuit block 204_2 serves as the negative output node (−) of the output stage 114. The operational amplifier based circuit 100 in FIG. 2 further includes a plurality of circuit blocks 206_1, 206_2 used to implement the feedback circuit 104 shown in FIG. 1, where the circuit block 206_1 serves as the feedback network 122, and the circuit block 206_2 serves as the feedback network 124. Since the operational amplifier 102 is a differential amplifier, the operational amplifier based circuit 100 in FIG. 2 can further include a circuit block 208 configured to act as a common-mode feedback loop circuit (which is not illustrated in FIG. 1). Since the present invention does not focus on the common-mode feedback loop circuit, related description is omitted here for brevity.

It should be noted that a conventional Miller compensation capacitor Cc in each of the circuit blocks 204_1, 204_4 (which serve as the output stage 114 of the operational amplifier 102) is removed. Due to the negative feedback configuration employed, the output node $N_6$ of the circuit block 204_1 is coupled to the input node $N_2$ of the circuit block 202 through the circuit block 206_1, and the output node $N_8$ of the circuit block 204_2 is coupled to the input node $N_1$ of the circuit block 202 through the circuit block 206_2. It should be noted that the input nodes $N_1$ and $N_2$ of the circuit block 202 are virtually grounded with no current flowing therethrough. That is, there is no current entering the input node $N_1$ and then reaching the output node $N_3$, and there is no current entering the input node $N_2$ and then reaching the output node $N_4$. Hence, after the conventional Miller compensation capacitor Cc electrically connected between the input node $N_5$ and the output node $N_6$ of the circuit block 204_1 is removed, no stability compensation circuit is driven at the output node $N_6$ of the circuit block 204_1. Similarly, after the conventional Miller compensation capacitor Cc electrically connected between the input node $N_7$ and the output node $N_8$ of the circuit block 204_2 is removed, no stability compensation circuit is driven at the output node $N_8$ of the circuit block 204_2. In other words, there is no stability compensation circuit driven at the output port of the operational amplifier 102 implemented using circuit blocks 202, 204_1, 204_2. In this way, the driving capability of the output stage 114 can be enhanced due to reduced load present at the output port of the output stage 114.

Figure 3:
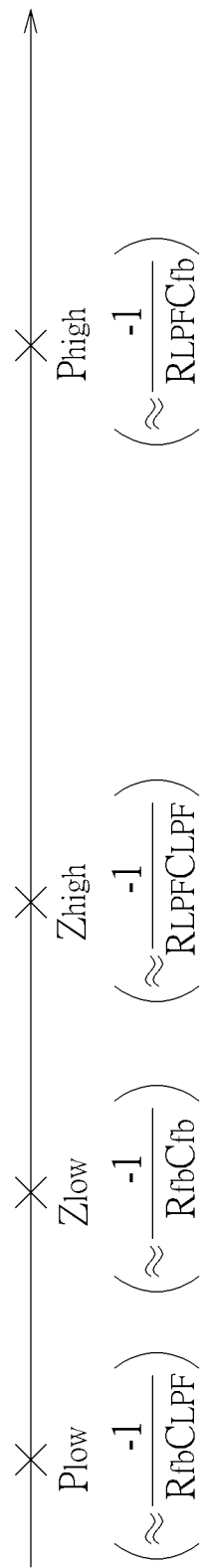
FIG. 3 is a diagram illustrating poles and zeros introduced by a differential-mode stability compensation circuit according to an embodiment of the present invention.

Since there is no Miller compensation capacitor in the output stage 114 (which is implemented using circuit blocks 204_1 and 204_2), the present invention proposes maintaining the differential-mode stability by using feedback factor (β) compensation. In this embodiment, a differential-mode stability compensation circuit arranged to apply differential-mode stability compensation to the operational amplifier 102 (which is implemented using circuit blocks 202, 204_1 and 204_2) is composed of the feedback circuit 104 (which is implemented using circuit blocks 206_1 and 206_2) and compensation circuits of the compensation circuit block 106 (which are implemented using circuit blocks 210_1 and 210_2, respectively). As shown in FIG. 2, the circuit block 210_1 includes a resistive component $R_{LPF}$ and a capacitive component $C_{LPF}$ connected in series, where the positive input signal INP of the differential input signal $S_{IN}$ is received through the circuit block 210_1 (e.g., positive input signal INP is received at an interconnection node of resistive component $R_{LPF}$ and capacitive component $C_{LPF}$); and the circuit block 210_2 also includes a resistive component $R_{LPF}$ and a capacitive component $C_{LPF}$ connected in series, where the negative input signal INN of the differential input signal $S_{IN}$ is received through the circuit block 210_2 (e.g., negative input signal INN is received at an interconnection node of resistive component $R_{LPF}$ and capacitive component $C_{LPF}$). In a case where the differential input signal $S_{IN}$ is a differential mixer output of an in-phase channel (or a quadrature channel), each of the positive input signal INP and the negative input signal INN is generated from one mixer. With regard to each of the circuit blocks 210_1 and 210_2, the resistive component $R_{LPF}$ and the capacitive component $C_{LPF}$ are arranged as a low-pass filter with no blocker suppression on a signal channel edge. In other words, the low-pass filter composed of the resistive component $R_{LPF}$ and the capacitive component $C_{LPF}$ is not intentionally designed for blocker suppression. FIG. 3 is a diagram illustrating poles and zeros introduced by the differential-mode stability compensation circuit according to an embodiment of the present invention. In this embodiment, the differential-mode stability compensation circuit has two poles $P_{low}$ and $P_{high}$ and two zeros $Z_{low}$ and $Z_{high}$ of a loop gain for each of the positive input signal INP and the negative input signal INN, where two zeros $Z_{low}$ and $Z_{high}$ can be arranged between two poles $P_{low}$ and $P_{high}$ to main-tain the differential stability easily. Moreover, from input signal's point of view, the pole formed by $C_{LPF}$ and $R_{LPF}$ can be designed far from the signal channel edge associated with each of the positive input signal INP and the negative input signal INN. For example, the bandwidth of the wanted signal is 20 MHz, and the first pole formed by $C_{LPF}$ and $R_{LPF}$ is located at 200 MHz. In this way, the differential-mode stability can be achieved without NF degradation on the signal channel edge.

Figure 4:
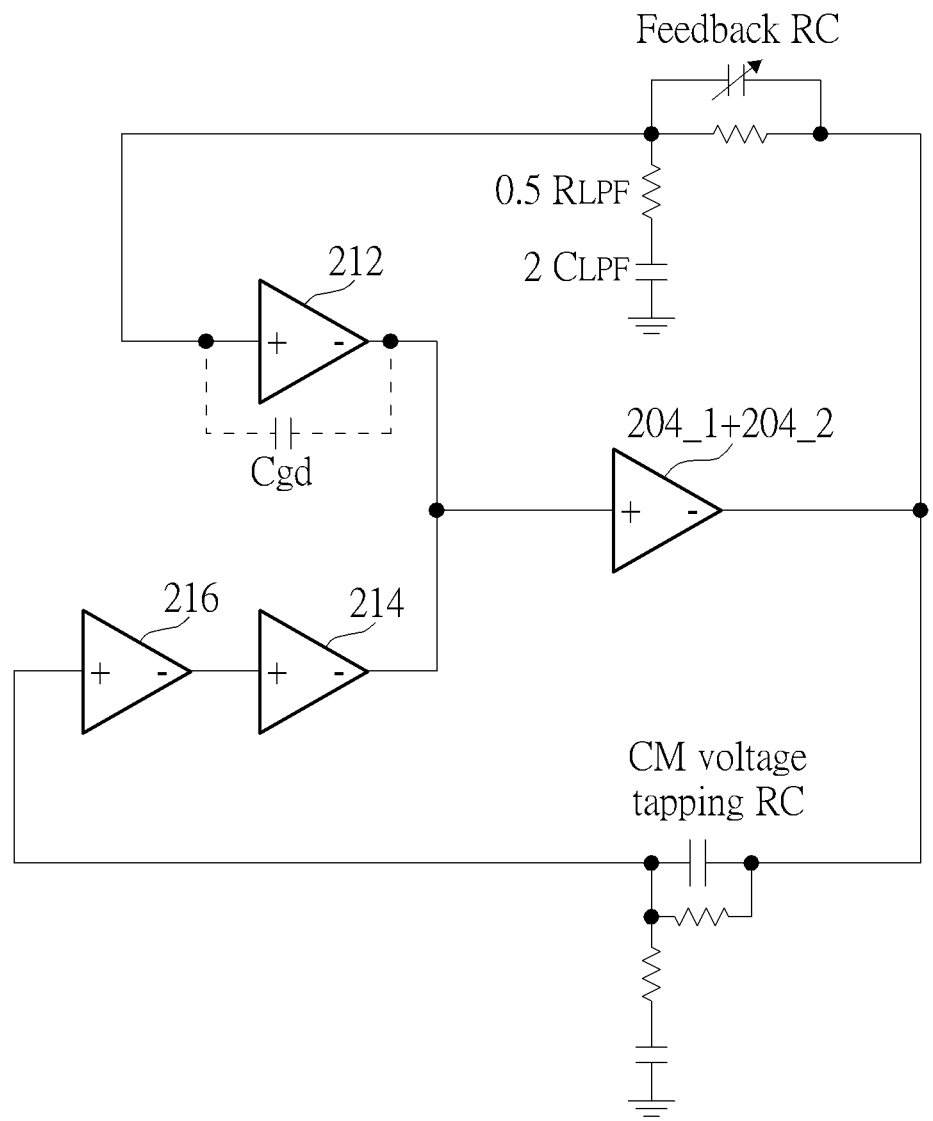
FIG. 4 is a diagram illustrating a common-mode equivalent circuit of the operational amplifier based circuit shown in FIG. 2.

As shown in FIG. 2, the input stage 112 is implemented using an input PMOS (P-channel metal-oxide-semiconductor) transistor circuit 212 and an input NMOS (N-channel metal-oxide-semiconductor) transistor circuit 214, where the input PMOS transistor circuit 212 includes a pair of PMOS transistors M1 and M2, and the input NMOS transistor circuit 214 includes a pair of NMOS transistors M3 and M4. In addition, the circuit block 208 is used as a common-mode feedback loop circuit, and therefore has an error amplifier 216 used for generating a control voltage to the NMOS transistors M3 and M4 in response to a detected common-mode voltage offset. FIG. 4 is a diagram illustrating a common-mode equivalent circuit of the operational amplifier based circuit 100 shown in FIG. 2. It should be noted that the common-mode gain of the input PMOS transistor circuit 212 with gate-to-drain capacitance (Cgd) is quite small and can be negligible. Based on this observation, the present invention proposes creating a common-mode stability compensation circuit by reusing the feedback circuit 104 and adding a compensation circuit between an input port of the input stage 112 and an input port of the output stage 114 (i.e., adding a compensation circuit between an input port and an output port of the input stage 112).

Figure 5:
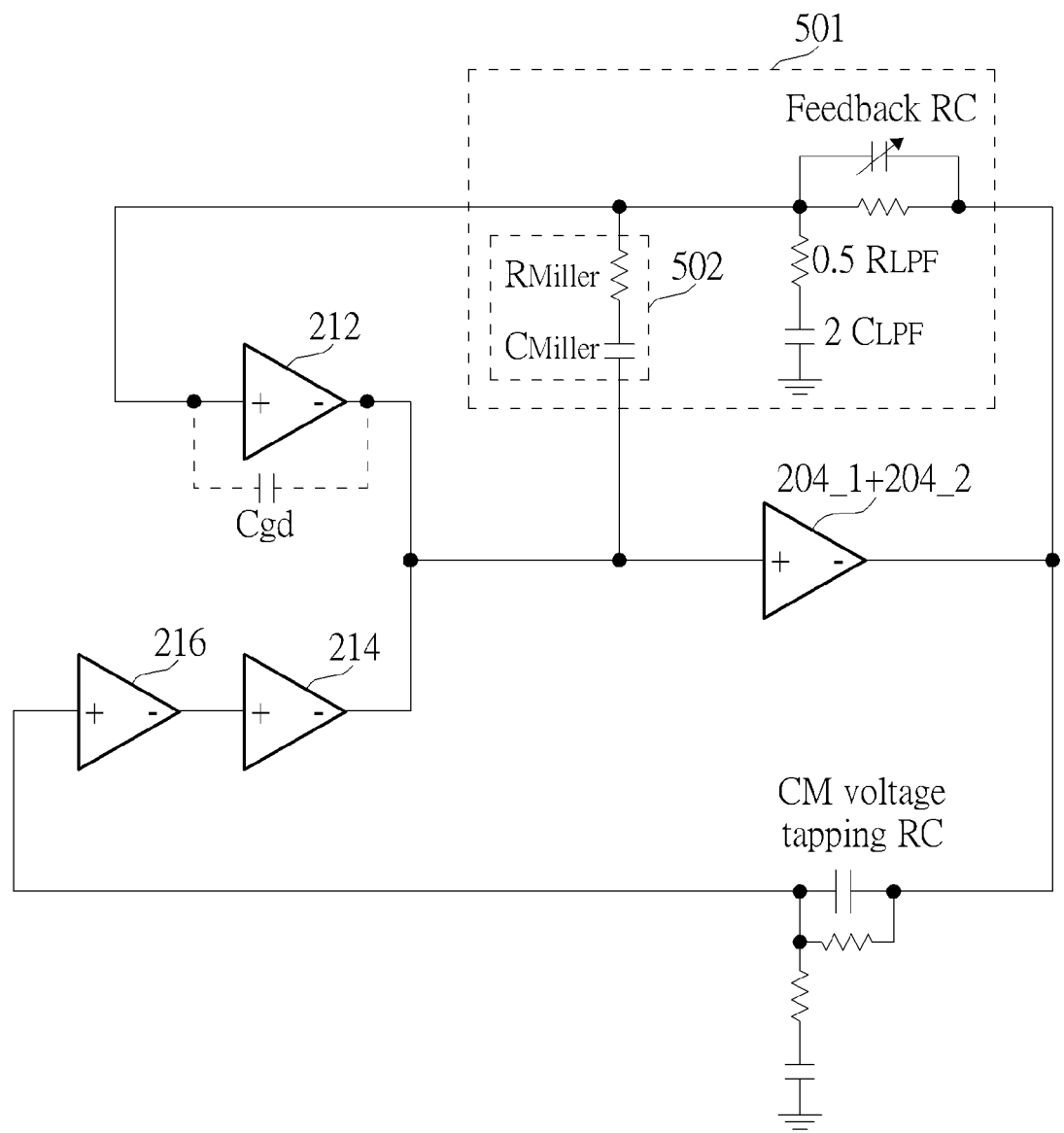
FIG. 5 is a diagram illustrating a common-mode equivalent circuit of an operational amplifier based circuit with a proposed common-mode stability compensation circuit added thereto.

FIG. 5 is a diagram illustrating a common-mode equivalent circuit of an operational amplifier based circuit with a proposed common-mode stability compensation circuit added thereto. As shown in FIG. 5, a common-mode stability compensation circuit 501 is established in the operational amplifier based circuit shown in FIG. 4 after a compensation circuit 502 is inserted between an input port of the input stage 112 and an input port of the output stage 114. The added compensation circuit 502 and the re-used feedback circuit (denoted by "Feedback RC") forma common-mode Miller compensation loop used to compensate for a common-mode feedback loop formed by error amplifier 216, input NMOS transistor circuit 214 and output stage (which is implemented using circuit blocks 204_1 and 204_2). It should be noted that the differential input port of the input stage 212 is virtually grounded with a very small voltage swing. Hence, in the differential operation mode, the compensation circuit 502, including a Miller compensation capacitor $C_{Miller}$, is fully driven by the input stage (which includes input PMOS transistor circuit 212) and thus has no impact on the driving capability of the output stage (which is implemented using circuit blocks 204_1 and 204_2). In other words, the driving current of the Miller compensation capacitor $C_{Miller}$ is from the input stage rather than the output stage. When the proposed common-mode stability compensation technique is employed by an operational amplifier, the loop gain simulation result shows that the common-mode gain of the input NMOS transistor circuit 214 can have a lower dominant pole. Hence, common-mode stability of the operational amplifier can be achieved by using the proposed common-mode stability compensation circuit.

Figure 6:
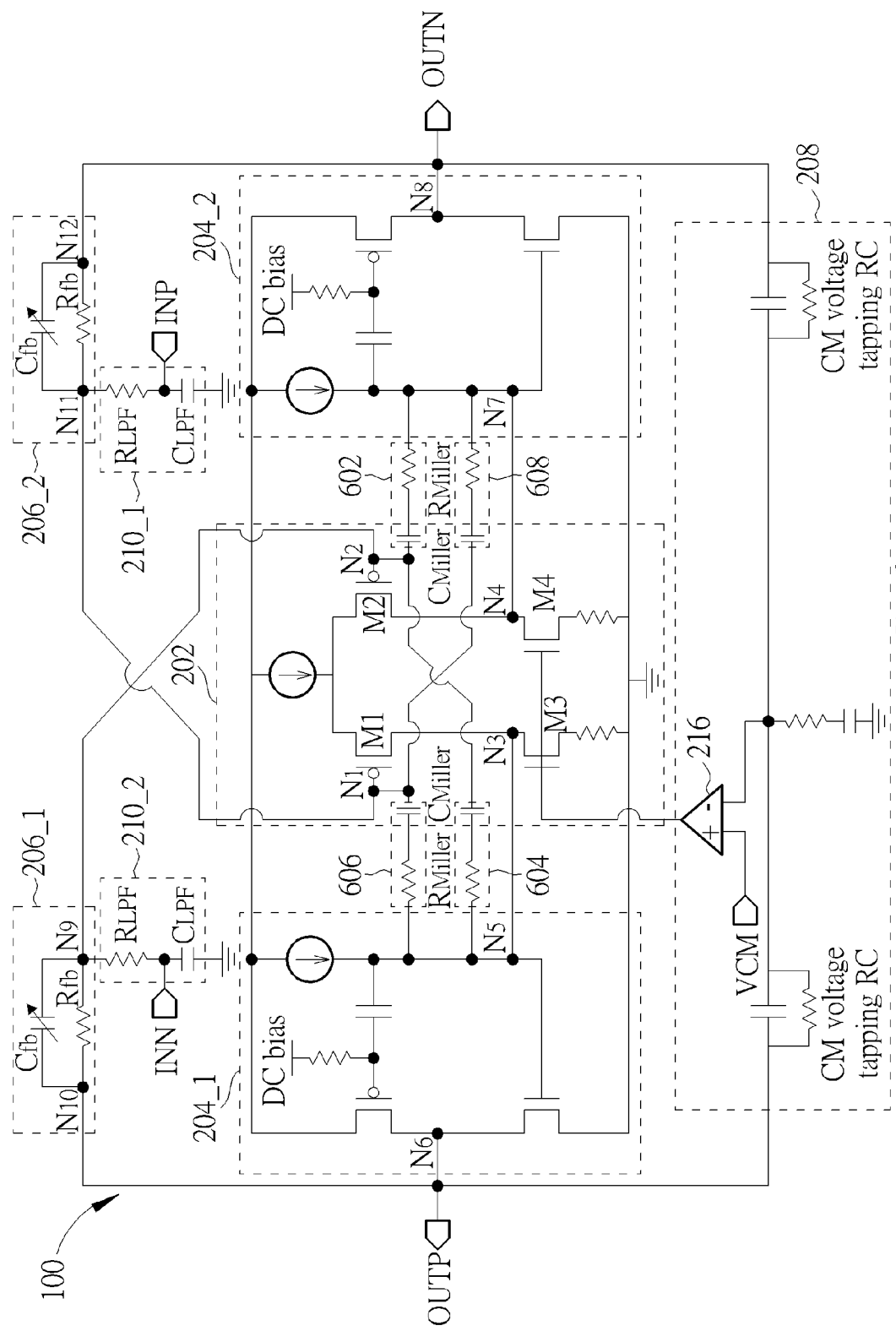
FIG. 6 is another circuit diagram of an operational amplifier based circuit according to an embodiment of the present invention.

FIG. 6 is another circuit diagram of an operational amplifier based circuit according to an embodiment of the present invention. The operational amplifier based circuit 100 shown in FIG. 1 can be implemented using the circuit structure shown in FIG. 6. The major difference between circuit structures shown in FIG. 2 and FIG. 6 is that the circuit structure shown in FIG. 6 has additional compensation circuits (e.g., 602, 604, 606, 608) included therein, where the compensation circuits 602, 604, 606, 608 can be a first part of a common-mode stability compensation circuit (e.g., 502 in FIG. 5), and the feedback circuit 104 (which is implemented using circuit blocks 206_1 and 206_2) can be reused as a second part of the common-mode stability compensation circuit (e.g., 502 in FIG. 5).

As shown in FIG. 6, the feedback network 122 (which is implemented using the circuit block 206_1) has a first node $N_9$ coupled to the negative input node $N_2$ of an input port of the input stage 112 (which is implemented using the circuit block 202), and further has a second node $N_{10}$ coupled to the positive output node $N_6$ of an output port of the output stage 114 (which is implemented using circuit blocks 204_1 and 204_2). In addition, the other feedback network 124 (which is implemented using the circuit block 206_2) has a first node $N_{11}$ coupled to the positive input node $N_1$ of the input port of the input stage 112 (which is implemented using the circuit block 202), and further has a second node $N_{12}$ coupled to the negative output node $N_8$ of the output port of the output stage 114 (which is implemented using circuit blocks 204_1 and 204_2).

Since the operational amplifier 102 is a differential amplifier, the CMSC in compensation circuit block 106 can be divided into 4 parts further to form a common-mode compensation circuit. The first compensation circuit 602 is coupled between nodes $N_9$ and $N_7$, the second compensation circuit 604 is coupled between nodes $N_9$ and $N_5$, the third compensation circuit 606 is coupled between nodes $N_{11}$ and $N_5$, and the fourth compensation circuit 608 is coupled between nodes $N_{11}$ and $N_7$. However, this is for illustrative purposes only, and is not meant to be a limitation of the present invention. Any single-ended/differential multi-stage operational amplifier using the proposed common-mode stability compensation technique to form one Miller compensation loop composed of a reused feedback network and an added compensation circuit still falls within the scope of the present invention.

Further, as shown in FIG. 6, the compensation circuits 602 and 604 are connected in series between nodes $N_5$ and $N_7$, and the compensation circuits 606 and 608 are also connected in series between nodes $N_5$ and $N_7$. In this embodiment, the compensation circuits 602, 604, 606, 608 are arranged in a cross-coupled connection fashion. Hence, the Miller effect resulting from the Miller compensation capacitors $C_{Miller}$ used in the common-mode stability compensation circuit can be neglected in the differential mode. In this way, the common-mode stability compensation circuit is used for common-mode stability compensation only, and has no impact on the differential-mode stability and driving capability of the operational amplifier. However, this is for illustrative purposes only, and is not meant to be a limitation of the present invention. In an alternative design, the compensation circuits 602, 604, 606, 608 may not be arranged in the cross-coupled connection fashion. Hence, a stability compensation circuit implemented using the compensation circuits 602, 604, 606, 608 and the circuit blocks 206_1 and 206_2 may be involved in differential-mode stability compensation. The same objective of maintaining stability of an operational amplifier without adding any extra compensation capacitor at an output port of the operational amplifier is achieved. This alternative design also falls within the scope of the present invention.

When the proposed differential-mode stability compensation technique and common-mode stability compensation technique are employed by an operational amplifier with an output stage having no Miller compensation capacitor, the loop gain simulation result shows that the unit-gain bandwidth of the operational amplifier is large (e.g., fT=7.37 GHz in 40-nm CMOS process) and the input impedance of the operational amplifier is much flatter than that of the conventional operational amplifier design. Since there is no filtering on the blocker signals with frequencies within the signal channel, one dB gain increased at blocker's frequency will result in 2-dB IIP2 (second order input intercept point) improvement. In addition, the driving capability of the output stage can be enhanced under a condition that differential-mode stability and common-mode stability can be maintained by the proposed compensation technique. Hence, a wide-bandwidth and high-linearity operational based circuit (e.g., TIA or filter) can be achieved.

The present invention focuses on a new compensation circuit design that can maintain the stability under a condition where no compensation circuit (e.g., conventional Miller compensation capacitor) is driven at the output port of the operation amplifier. It should be noted that internal circuit designs of the operation amplifier and the common-mode voltage calibration circuit included in the operation amplifier based circuit as shown in FIG. 2 and FIG. 6 are for illustrative purposes only, and are not meant to be limitations of the present invention. That is, an operational amplifier having a different amplifier structure and employing the proposed compensation technique still falls within the scope of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An operational amplifier based circuit comprising:
   an operational amplifier, wherein the operational amplifier is a multi-stage amplifier;
   a feedback circuit, coupled between an output port and an input port of the operational amplifier; and
   a compensation circuit block, comprising circuits involved in stability compensation of the operational amplifier;
   wherein the compensation circuit block comprises a first part of a stability compensation circuit arranged to apply the stability compensation to the operational amplifier, and the feedback circuit is reused as a second part of the stability compensation circuit; and there is no other stability compensation circuit connected to the output port of the operational amplifier;
   wherein the operational amplifier is a differential amplifier, and the stability compensation circuit is a differential-mode stability compensation circuit arranged to apply differential-mode stability compensation to the operational amplifier.

2. The operational amplifier based circuit of claim 1, wherein the operational amplifier has an output stage, and no Miller compensation capacitor is across the output stage.

3. The operational amplifier based circuit of claim 1, wherein the feedback circuit comprises:
   a feedback network, comprising:
      a first node, coupled to one input node of the input port; and a second node, coupled to one output node of the output port;

the compensation circuit block comprises:

a compensation circuit, coupled to the first node of the feedback network and said one input node of the input port, wherein one input signal of the operational amplifier based circuit is received through the compensation circuit.

4. The operational amplifier based circuit of claim 3, wherein the compensation circuit comprises a resistive component and a capacitive component connected in series, and said one input signal of the operational amplifier based circuit is received at an interconnection node between the resistive component and the capacitive component.

5. The operational amplifier based circuit of claim 4, wherein said input signal of the operational amplifier based circuit is a mixer output, and the resistive component and the capacitive component are arranged as a low-pass filter with no blocker suppression on a signal channel edge.

6. The operational amplifier based circuit of claim 1, wherein the operational amplifier is a multi-stage amplifier having an output stage, the feedback circuit comprises:

a first feedback network, comprising:
a first node, coupled to one input node of the input port; and
a second node, coupled to one output node of the output port;

the compensation circuit block comprises:
a first compensation circuit, coupled between the first node of the first feedback network and one input node of the output stage.

7. The operational amplifier based circuit of claim 6, wherein the first compensation circuit comprises at least a capacitive component.

8. The operational amplifier based circuit of claim 6, wherein the multi-stage amplifier is a differential amplifier, and the compensation circuit block further comprises:

a second compensation circuit, coupled between the first node of the first feedback network and another input node of the output stage.

9. The operational amplifier based circuit of claim 8, wherein the feedback circuit further comprises:

a second feedback network, comprising:
a first node, coupled to another input node of the input port; and
a second node, coupled to another output node of the output port;

the compensation circuit block further comprises:
a third compensation circuit, coupled between the first node of the second feedback network and said another input node of the output stage; and
a fourth compensation circuit, coupled between the first node of the second feedback network and said one input node of the output stage.

10. The operational amplifier based circuit of claim 9, wherein the first compensation circuit, the second compensation circuit, the third compensation circuit, and the fourth compensation circuit are arranged in a cross-coupled connection fashion.

11. An operational amplifier based circuit comprising:

a multi-stage operational amplifier, comprising an output stage;

a feedback circuit, coupled between an output port and an input port of the multi-stage operational amplifier, the feedback circuit comprising:

a first feedback network, comprising:
a first node, coupled to one input node of the input port; and
a second node, coupled to one output node of the output port; and a compensation circuit block, comprising circuits involved in stability compensation of the multi-stage operational amplifier, the compensation circuit block comprising:

a first compensation circuit, coupled between the first node of the feedback network and one input node of the output stage;

wherein the compensation circuit block comprises a first part of a stability compensation circuit arranged to apply the stability compensation to the operational amplifier, and the feedback circuit is reused as a second part of the stability compensation circuit.

12. The operational amplifier based circuit of claim 11, wherein the first compensation circuit comprises at least a capacitive component.

13. The operational amplifier based circuit of claim 11, wherein the multi-stage operational amplifier is a differential amplifier, and the compensation circuit block further comprises:

a second compensation circuit, coupled between the first node of the first feedback network and another input node of the output stage.

14. The operational amplifier based circuit of claim 13, wherein the feedback circuit further comprises:

a second feedback network, comprising:
a first node, coupled to another input node of the input port; and
a second node, coupled to another output node of the output port;

the compensation circuit block further comprises:
a third compensation circuit, coupled between the first node of the second feedback network and said another input node of the output stage; and
a fourth compensation circuit, coupled between the first node of the second feedback network and said one input node of the output stage.

15. The operational amplifier based circuit of claim 14, wherein the first compensation circuit, the second compensation circuit, the third compensation circuit, and the fourth compensation circuit are arranged in a cross-coupled connection fashion.

16. An operational amplifier based circuit comprising:

a differential operational amplifier;

a feedback circuit, coupled between an output port and an input port of the differential operational amplifier; and a compensation circuit block, comprising circuits involved in stability compensation of the differential operational amplifier;

wherein the compensation circuit block comprises a first part of a common-mode stability compensation circuit arranged to apply common-mode stability compensation to the differential operational amplifier, and the feedback circuit is reused as a second part of the common-mode stability compensation circuit.

17. An operational amplifier based circuit comprising:

an operational amplifier;

a feedback circuit, coupled between an output port and an input port of the operational amplifier; and a compensation circuit block, comprising circuits involved in stability compensation of the operational amplifier;

wherein the compensation circuit block comprises a first part of a stability compensation circuit arranged to apply the stability compensation to the operational amplifier, and the feedback circuit is reused as a second part of the stability compensation circuit; and there is no other stability compensation circuit connected to the output port of the operational amplifier;

wherein the operational amplifier is a differential amplifier, and the stability compensation circuit is a differential-mode stability compensation circuit arranged to apply differential-mode stability compensation to the operational amplifier.

18. The operational amplifier based circuit of claim 17, wherein the operational amplifier is a multi-stage amplifier having an output stage, and no Miller compensation capacitor is across the output stage.

19. The operational amplifier based circuit of claim 17, wherein the feedback circuit comprises:
  a feedback network, comprising:
    a first node, coupled to one input node of the input port; and
    a second node, coupled to one output node of the output port;
  the compensation circuit block comprises:
    a compensation circuit, coupled to the first node of the feedback network and said one input node of the input port, wherein one input signal of the operational amplifier based circuit is received through the compensation circuit.

20. The operational amplifier based circuit of claim 17, wherein the operational amplifier is a multi-stage amplifier having an output stage, the feedback circuit comprises:
  a first feedback network, comprising:
    a first node, coupled to one input node of the input port; and
    a second node, coupled to one output node of the output port;
  the compensation circuit block comprises:
    a first compensation circuit, coupled between the first node of the first feedback network and one input node of the output stage.

21. An operational amplifier based circuit comprising:
  an operational amplifier;
  a feedback circuit, coupled between an output port and an input port of the operational amplifier; and
  a compensation circuit block, comprising circuits involved in stability compensation of the operational amplifier;
  wherein the compensation circuit block comprises a first part of a stability compensation circuit arranged to apply the stability compensation to the operational amplifier, and the feedback circuit is reused as a second part of the stability compensation circuit; and there is no other stability compensation circuit connected to the output port of the operational amplifier;
  wherein the operational amplifier is a differential amplifier, and the stability compensation circuit is a common-mode stability compensation circuit arranged to apply common-mode stability compensation to the operational amplifier.

22. The operational amplifier based circuit of claim 21, wherein the operational amplifier is a multi-stage amplifier having an output stage, and no Miller compensation capacitor is across the output stage.

23. The operational amplifier based circuit of claim 21, wherein the feedback circuit comprises:
  a feedback network, comprising:
    a first node, coupled to one input node of the input port; and
    a second node, coupled to one output node of the output port;
  the compensation circuit block comprises:
    a compensation circuit, coupled to the first node of the feedback network and said one input node of the input port, wherein one input signal of the operational amplifier based circuit is received through the compensation circuit.

24. The operational amplifier based circuit of claim 21, wherein the operational amplifier is a multi-stage amplifier having an output stage, the feedback circuit comprises:
  a first feedback network, comprising:
    a first node, coupled to one input node of the input port; and
    a second node, coupled to one output node of the output port;
  the compensation circuit block comprises:
    a first compensation circuit, coupled between the first node of the first feedback network and one input node of the output stage.

25. An operational amplifier based circuit comprising:
  an operational amplifier;
  a feedback circuit, coupled between an output port and an input port of the operational amplifier; and
  a compensation circuit block, comprising circuits involved in stability compensation of the operational amplifier;
  wherein the compensation circuit block comprises a first part of a stability compensation circuit arranged to apply the stability compensation to the operational amplifier, and the feedback circuit is reused as a second part of the stability compensation circuit; and there is no other stability compensation circuit connected to the output port of the operational amplifier;
  wherein the feedback circuit comprises:
    a feedback network, comprising:
      a first node, coupled to one input node of the input port; and
      a second node, coupled to one output node of the output port;
    the compensation circuit block comprises:
      a compensation circuit, coupled to the first node of the feedback network and as said one input node of the input port, wherein one input signal of the operational amplifier based circuit is received through the compensation circuit; and the compensation circuit comprises a resistive component and a capacitive component connected in series, and said one input signal of the operational amplifier based circuit is received at an interconnection node between the resistive component and the capacitive component.

26. The operational amplifier based circuit of claim 25, wherein the operational amplifier is a multi-stage amplifier having an output stage, and no Miller compensation capacitor is across the output stage.

27. The operational amplifier based circuit of claim 25, wherein said input signal of the operational amplifier based circuit is a mixer output, and the resistive component and the capacitive component are arranged as a low-pass filter with no blocker suppression on a signal channel edge.

28. An operational amplifier based circuit comprising:
an operational amplifier;
a feedback circuit, coupled between an output port and an input port of the operational amplifier; and
a compensation circuit block, comprising circuits involved in stability compensation of the operational amplifier;
wherein the compensation circuit block comprises a first part of a stability compensation circuit arranged to apply the stability compensation to the operational amplifier, and the feedback circuit is reused as a second part of the stability compensation circuit; and there is no other stability compensation circuit connected to the output port of the operational amplifier;
wherein the operational amplifier is a multi-stage amplifier having an output stage, the feedback circuit comprises:
a first feedback network, comprising:
a first node, coupled to one input node of the input port; and
a second node, coupled to one output node of the output port;
the compensation circuit block comprises:
a first compensation circuit, coupled between the first node of the first feedback network and one input node of the output stage.

29. The operational amplifier based circuit of claim 28, wherein the operational amplifier is a multi-stage amplifier having an output stage, and no Miller compensation capacitor is across the output stage.

30. The operational amplifier based circuit of claim 28, wherein the first compensation circuit comprises at least a capacitive component.

31. The operational amplifier based circuit of claim 28, wherein the multi-stage amplifier is a differential amplifier, and the compensation circuit block further comprises:
a second compensation circuit, coupled between the first node of the first feedback network and another input node of the output stage.

32. An operational amplifier based circuit comprising:
an operational amplifier, wherein the operational amplifier is a multi-stage amplifier;
a feedback circuit, coupled between an output port and an input port of the operational amplifier; and
a compensation circuit block, comprising circuits involved in stability compensation of the operational amplifier;
wherein the compensation circuit block comprises a first part of a stability compensation circuit arranged to apply the stability compensation to the operational amplifier, and the feedback circuit is reused as a second part of the stability compensation circuit; and there is no other stability compensation circuit connected to the output port of the operational amplifier;
wherein the operational amplifier is a differential amplifier, and the stability compensation circuit is a common-mode stability compensation circuit arranged to apply common-mode stability compensation to the operational amplifier.

33. The operational amplifier based circuit of claim 32, wherein the operational amplifier has an output stage, and no Miller compensation capacitor is across the output stage.

34. The operational amplifier based circuit of claim 32, wherein the feedback circuit comprises:
a feedback network, comprising:
a first node, coupled to one input node of the input port; and
a second node, coupled to one output node of the output port;
the compensation circuit block comprises:
a compensation circuit, coupled to the first node of the feedback network and said one input node of the input port, wherein one input signal of the operational amplifier based circuit is received through the compensation circuit.

35. The operational amplifier based circuit of claim 34, wherein the compensation circuit comprises a resistive component and a capacitive component connected in series, and said one input signal of the operational amplifier based circuit is received at an interconnection node between the resistive component and the capacitive component.

36. The operational amplifier based circuit of claim 35, wherein said input signal of the operational amplifier based circuit is a mixer output, and the resistive component and the capacitive component are arranged as a low-pass filter with no blocker suppression on a signal channel edge.

37. The operational amplifier based circuit of claim 32, wherein the operational amplifier is a multi-stage amplifier having an output stage, the feedback circuit comprises:
a first feedback network, comprising:
a first node, coupled to one input node of the input port; and
a second node, coupled to one output node of the output port;
the compensation circuit block comprises:
a first compensation circuit, coupled between the first node of the first feedback network and one input node of the output stage.

38. The operational amplifier based circuit of claim 37, wherein the first compensation circuit comprises at least a capacitive component.

* * * * *